United States Patent [19]
Hasegawa

[11] Patent Number: 5,791,357
[45] Date of Patent: Aug. 11, 1998

[54] SUPPORT JIG FOR THIN CIRCULAR OBJECTS

[75] Inventor: Norio Hasegawa, Nagano, Japan

[73] Assignee: Shin-Etsu Handotai Co., Ltd., Tokyo, Japan

[21] Appl. No.: 867,450

[22] Filed: Jun. 2, 1997

[30] Foreign Application Priority Data

Jun. 6, 1996 [JP] Japan .................................. 8-166784

[51] Int. Cl.⁶ .................................................. B08B 3/04
[52] U.S. Cl. .................. 134/137; 134/147; 134/153; 134/201; 134/902; 211/41.18
[58] Field of Search .................. 134/147, 148, 134/153, 137, 140, 902, 201, 161; 211/41.18

[56] References Cited

U.S. PATENT DOCUMENTS

| 2,555,594 | 6/1951 | Markovitz | 206/309 |
| 3,923,156 | 12/1975 | Wallestad et al. | |
| 4,669,612 | 6/1987 | Mortensen | 134/182 |

FOREIGN PATENT DOCUMENTS

| 53-144265 | 12/1978 | Japan | 134/902 |
| 61-284927 | 12/1986 | Japan | 134/902 |
| 62-283632 | 12/1987 | Japan | 134/902 |
| 3-116731 | 5/1991 | Japan | 134/902 |
| 3-233930 | 10/1991 | Japan | 134/902 |
| 3-2666431 | 11/1991 | Japan | 134/902 |
| 4-56321 | 2/1992 | Japan | 134/902 |
| 5-47738 | 2/1993 | Japan | 134/902 |

OTHER PUBLICATIONS

IBM Techanicla Disclosure Bulletin vol. 8 No. 2, May 1966.

*Primary Examiner*—Frankie L. Stinson
*Attorney, Agent, or Firm*—Oliff & Berridge, PLC

[57] ABSTRACT

A support jig for thin circular objects comprises two round rods, in each of which depressions, each having a substantially V-shaped cross section, are formed along the circumference of the round rod and perpendicularly to the center axis of the round rod and arranged along the center axis of the round rod. Thin circular objects are inserted into respective depressions formed in the round rods, so that the thin circular objects are supported by the support jig. A cut is formed in each of a plurality of side wall portions which define depressions such that the cut is symmetrical with respect to the perpendicular which connects the center of each of the supported thin circular objects and the center axis of each of the round bars. The support jig can stably retain thin circular objects, particularly wafers, upright so that their upper portions do not vibrate, and can reduce the areas subjected to surface tension.

6 Claims, 9 Drawing Sheets

SUPPORT JIG FOR THIN CIRCULAR OBJECTS

BACKGROUND OF THE INVENTION

1. Field of the Invention

The present invention relates to a support jig which can support a plurality of thin circular objects, particularly precision thin circular objects such as semiconductor wafers and liquid crystal panels, and which is used when such thin circular objects are subjected to processing with solutions or transported. The present invention also relates to a solution-processing bath equipped with the support jig as well as a retaining jig equipped with the support jig.

2. Description of the Related Art

Semiconductor mirror-finished wafers are manufactured by subjecting semiconductor wafers, which are obtained from a monocrystalline ingot of silicon or the like through slicing, to a series of steps comprising chamfering, lapping, cleaning, etching, cleaning, mirror-polishing, cleaning, etc.

In many cases of manufacture of semiconductor mirror-finished wafers, a plurality of wafers are positioned upright when they are subjected to processing with solutions such as etching and cleaning or being transported. Thus is used a support jig for maintaining wafers in an upright state. In cleaning of wafers, a carrier (basket) is conventionally used as both a support jig and a transport jig. That is, after wafers are placed into a carrier, the carrier is immersed into one of cleaning solutions contained in a plurality of baths and taken out therefrom. Subsequently, the carrier is transported in the air to a subsequent bath. This operation is repeated to clean the wafers.

However, the use of a carrier involves a tendency for a cleaning solution to remain in gaps between the carrier and wafers, causing contamination of the cleaning solution in the next bath with the remaining solution, with a resultant decrease of cleaning efficiency. In recent years, therefore, so-called cassetteless cleaning has been becoming popular wherein a jig for retaining wafers in an upright state is provided in each cleaning bath while a separate jig is used for transport of wafers.

Figure 10:
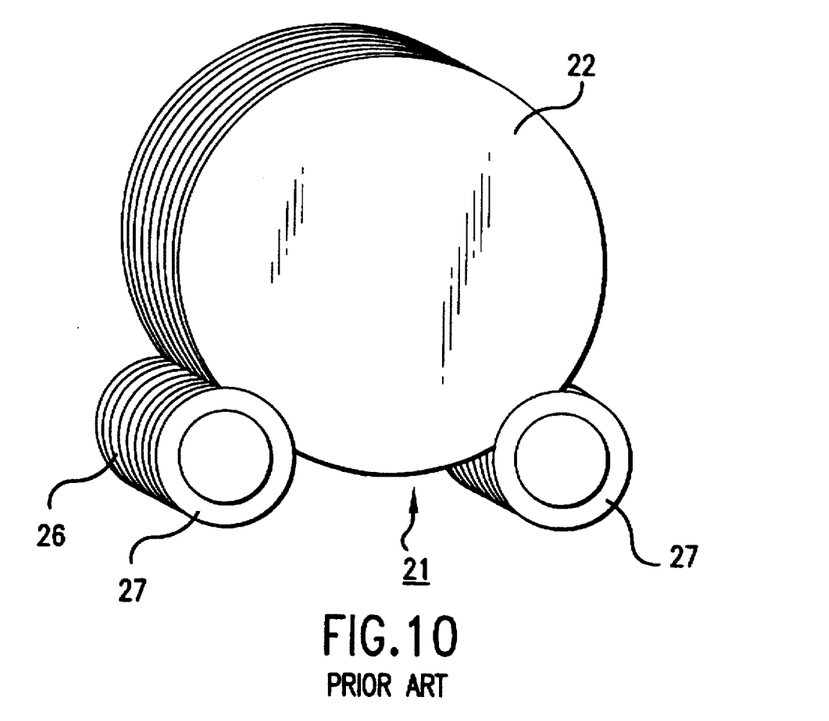
FIG. 10 is a schematic view of a conventional support jig for semiconductor wafers used in cassetteless cleaning, illustrating the state of wafers being retained by the jig.
Figure 11:
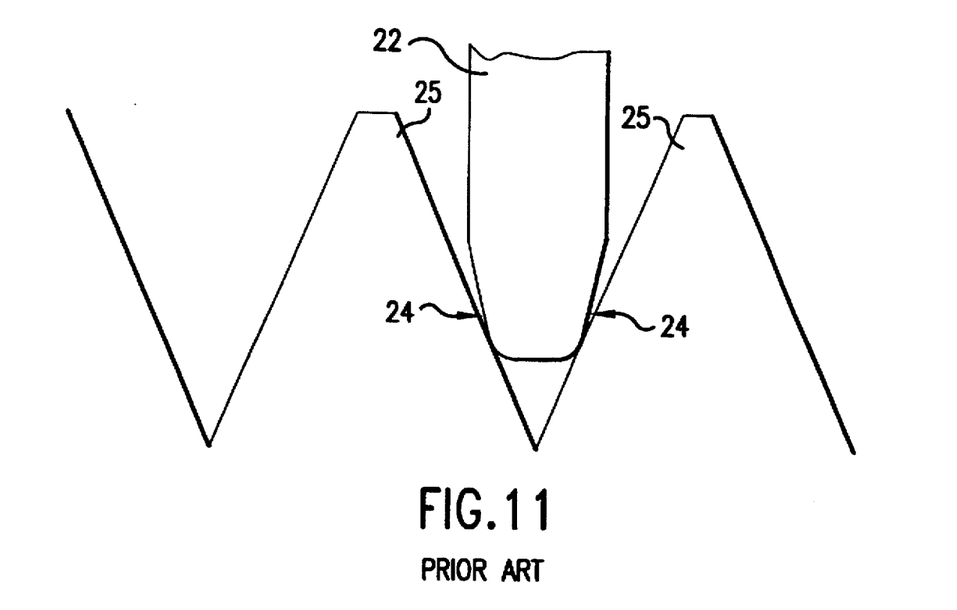
FIG. 11 is a view illustrating the state of contact between a wafer and the support jig.

FIG. 10 shows an example of wafers being retained with a support jig used in cassetteless cleaning. As shown in FIG. 10, a conventional support jig 21 used for retaining wafers in cassetteless cleaning comprises two round bars 27 in which depressions 26, each having a V-shaped cross-section and being formed along the circumference thereof, are arranged in a longitudinal direction thereof. In other words, the conventional support jig 21 comprises two round bars, each of which has a shape like a series of abacus beads and which are fixedly arranged in-parallel such that corresponding depressions face each other. This support jig is usually disposed on the bottom portion of a cleaning bath. Wafers 22 are placed one by one into the depressions 26 such that they rest on the two round rods 27. In this case, as shown in FIG. 11, side wall portions 25 defining a depression contact the side surfaces 24 of the wafer 22 on the perpendiculars which connect the center of the wafer 22 and the center axis of each round bar 27. As such, the wafers 22 are retained upright within the cleaning bath.

Figure 12:
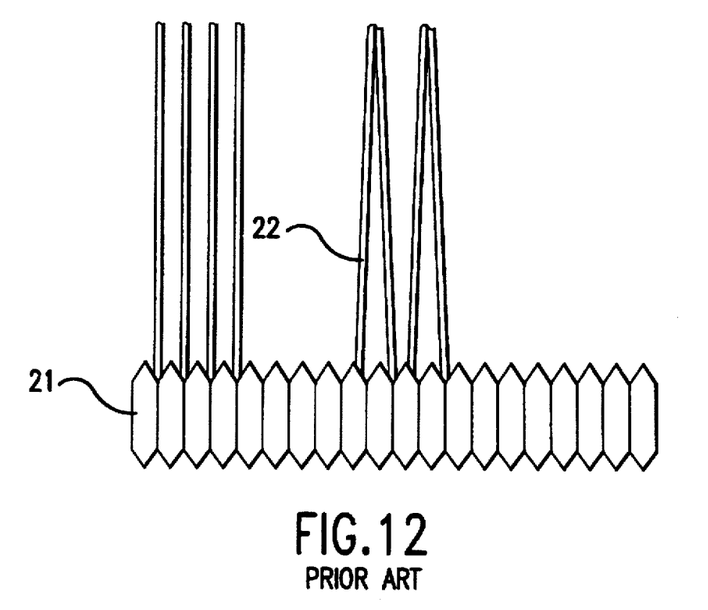
FIG. 12 is a schematic view illustrating that the conventional support jig for semiconductor wafers fails to stably retain wafers.

However, according to the above-described retainment of the wafers 22, the wafers 22 are supported upright at considerably lower portions thereof, and as shown in FIG. 11, each of the wafers 22 contacts each of the two round rods 27 at two points, i.e. contacts the two round rods 27, which compose the support jig, at four points. The count of "four" contact points is insufficient for stably retaining the wafer 22. For example, due to vibration of the cleaning bath and the flow of a cleaning solution around the wafers 22 during cleaning, as shown in FIG. 12, the upper portions of the wafers 22 vibrate, and consequently the adjacent wafers 22 may contact each other, resulting in a higher possibility of scratches being formed on the surfaces thereof.

Figure 13:
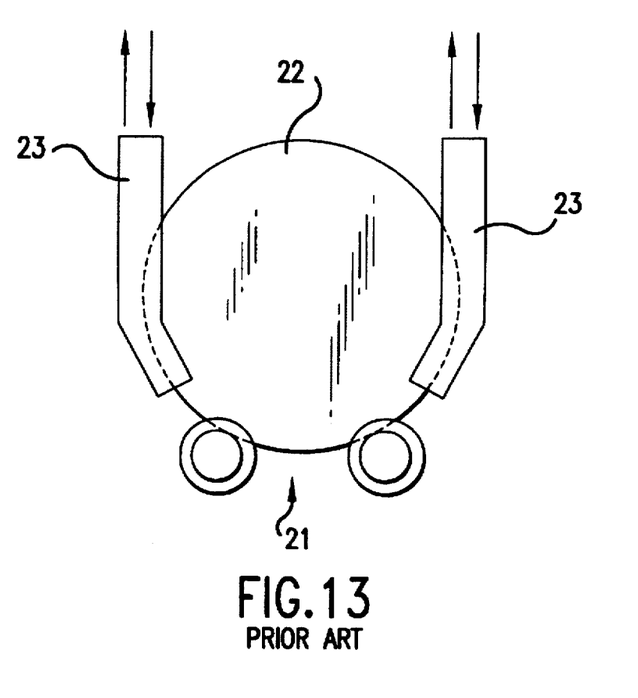
FIG. 13 is a view illustrating the positional relation among a wafer transport jig (cassetteless arms), a wafer, and a support jig for wafers.

To solve this problem, the support jig may be disposed at a higher position so as to contact the upright wafers 22 at higher portions thereof. This arrangement enables the wafers 22 to stably stand upright with no vibration induced at the upper portions thereof. However, in this case, the support jig hinders the use of wafer transport jigs (cassetteless arms) 23 as shown in FIG. 13, which are commonly used in cassetteless cleaning.

Accordingly, there has been eager demand for a support jig capable of being used in cassetteless cleaning and retaining wafers stably upright with no vibration induced at the upper portions of the wafers.

Further, a support jig used for retaining wafers during processing with a solution, as in cleaning or etching, and a support jig serving also as a transport jig are required to have a smaller number of points of contact with each wafer. This is because solution-processing equipment is designed to have a cleaning solution or a like processing solution flow as uniformly as possible in order to uniformly process the entire wafer surface with a solution, but contact of a wafer with the support jig tends to hinder the flow of a processing solution due to surface tension of a solution induced on the wafer surface in the vicinity of the contact point.

Also, when a wafer support jig serves also as a wafer transport jig, surface tension causes a processing solution to remain between a wafer and the support jig in the vicinity of a contact point therebetween when the support jig is taken out from a solution-processing bath into the air while wafers are situated in depressions formed in the support jig. This remaining solution causes a serious contamination problem in the subsequent step. Accordingly, it is desirable to reduce the number of points of contact between a wafer and the support jig to thereby minimize an influential range of surface tension and thus minimize the amount of a remaining processing solution.

SUMMARY OF THE INVENTION

Accordingly, an object of the present invention is to provide a support jig for semiconductor wafers which is capable of stably retaining wafers upright so that the upper portions of wafers do not vibrate, and is capable of reducing an influential range of surface tension. However, in order to reduce the influential range of surface tension, usually the number of points of contact between a wafer and the support jig must be decreased. As the number of points of contact between a wafer and the support jig decreases, support stability of wafers deteriorates. Thus, it was considered that in order to achieve the object of the present invention, two contradictory factors must be taken into consideration.

The inventor of the present invention conducted extensive studies in an attempt to solve the above-described problems and found that they can be solved through formation of a cut in each of a plurality of side wall portions which define depressions in the above-described support jig. In the above-described prior art, a wafer contacts the support jig, which comprises two round rods, at-a total of four points. In the present invention, a cut is formed in each of a plurality of side wall portions which define depressions such that such a conventional contact point is located at the center of the cut and instead a wafer contacts the support jig through the cut end portions of two side wall portions located on both sides of the cuts thereof. The cut end portions of each side wall portion emerge at both ends of the cut thereof, and each cut end portion defines a depression having a substantially V-shaped cross section. Accordingly, a wafer contacts one of two round bars of the support jig at four points and thus contacts the support jig at eight points. Therefore, the support jig can stably support wafers with no vibration induced at upper portions of the wafers. In addition, as a result of formation of a cut, an influential range of surface tension can be reduced, thereby decreasing hindrance to the flow of a processing solution and the amount of a processing solution remaining on a wafer.

This support jig can support not only semiconductor wafers but also any thin circular objects and can be used to retain thin circular objects, particularly precision circular objects requiring uniform, clean surface processing, in a processing bath for processing them with a solution in cleaning, etching, and like steps. Further, the support jig can stably support wafers so that no vibration is induced at the upper portions of the wafers, and can also serve as a transport jig by simple attachment of a handle thereto.

According to a first aspect of the present invention, there is provided a support jig for thin circular objects which comprises two round rods, in each of which depressions, each having a substantially V-shaped cross section, are formed along the circumference of the round rod and perpendicularly to the center axis of the round rod and arranged along the center axis of the round rod, and means for fixing the round rods in place, and which supports thin circular objects through insertion of them into respective depressions formed in the round rods, wherein a cut is formed in each of a plurality of side wall portions which define depressions such that the cut is symmetrical with respect to the perpendicular which connects the center of each of the supported thin circular objects and the center axis of each of the round bars.

As described above, a cut is formed in each of a plurality of side wall portions which define depressions. Accordingly, a thin circular object contacts the support jig through the cut end portions of two side wall portions located on both sides of the cuts thereof. The cut end portions of each side wall portion emerge at both ends of the cut of the side wall portion, and each cut end portion defines a depression having a substantially V-shaped cross section. As a result, a thin circular object contacts the support jig at eight points to thereby be retained stably. In addition, as a result of formation of the cut, an influential range of surface tension can be reduced, thereby providing a uniform flow of a processing solution and decreasing the amount of a processing solution remaining on a thin circular object. Accordingly, through use of the above-described support jig, for example, in cleaning or transporting equipment in place of a conventionally used support jig, the surfaces of, for example, semiconductor wafers can be cleaned uniformly and highly efficiently with no scratches being formed thereon.

According to a second aspect of the present invention, there is provided a solution-processing bath for processing thin circular objects with a solution therein equipped with the above-described support jig. This solution-processing bath can be used as, for example, a cleaning bath for cleaning semiconductor wafers through use of cassetteless arms. In this case, even when the cleaning bath vibrate, and a cleaning solution flows around wafers, adjacent wafers do not collide with each other, i.e. wafers are stably retained in the cleaning bath to thereby be protected from formation of scratches on their surfaces.

According to a third aspect of the present invention, there is provided a retaining jig for thin circular objects comprising the above-described support jig and a handle and serving also as a transport jig. Since thin circular objects can be stably retained by the support jig having the above-described cuts formed therein, the support jig can also be used as a transport jig by simple attachment of a handle thereto with no need for attaching other supporting members thereto. In contrast with a conventionally used carrier, this combination support-and-transport jig enables the entire surface of the thin circular object to be uniformly processed with a solution and reduces an influential range of surface tension to thereby decrease the amount of a processing solution remaining on a thin circular object, thus suppressing contamination of the subsequent solution-processing bath.

The present invention is particularly effective when thin circular objects are semiconductor wafers. This is because the presence of even slight stain or scratches on the semiconductor wafer surface represents a big problem for wafers, and the wafer surface must be very uniformly processed with a solution, and these requirements are satisfied by the present invention.

In the present invention, the number of points of contact between the support jig and a thin circular object increases to thereby stably retain the thin circular object, particularly a semiconductor wafer, upright, and thus the formation of scratches on the object surface can be prevented during processing with a solution or transport. Further, an influential range of surface tension on the thin circular object and the support jig decreases, whereby the entire surface of a thin circular object can be uniformly and highly efficiently processed with a solution.

DESCRIPTION OF THE PREFERRED EMBODIMENTS

Embodiments of the present invention will now be described in detail with reference to the drawings.

Figure 1:
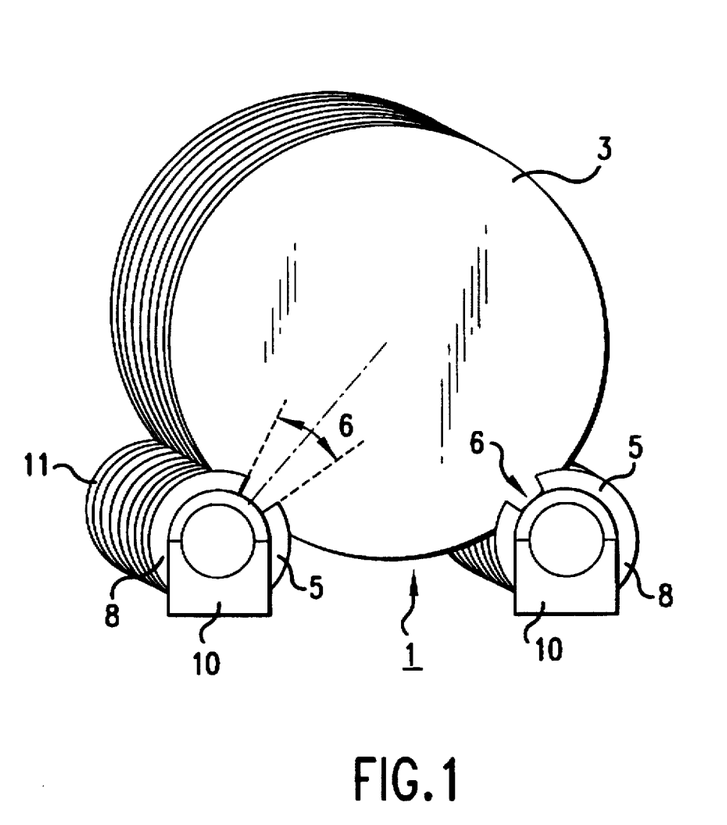
FIG. 1 is a schematic view showing an embodiment of a support jig for circular thin objects according to the present invention.

FIG. 1 shows an embodiment of a support jig. of the present invention, illustrating thin circular objects being retained on the support jig.

As shown in FIG. 1, a support jig 1 of the present invention comprises two round rods 8 and means 10 for fixing the round rods 8 in place. In each round rod 8, depressions 11, each having a substantially V-shaped cross section, are formed along the circumference of the round rod 8 and arranged along the center axis of the round rod 8. Thin circular objects 3 are situated one by one in corresponding depressions 11 of the round bars 8. A cut 6 is formed in each of a plurality of side wall portions 5 which define the depressions 11 such that the cut is symmetrical with respect to the perpendicular which connects the center of each supported thin circular object 3 and the center axis of each round bar 8.

Figure 2A:
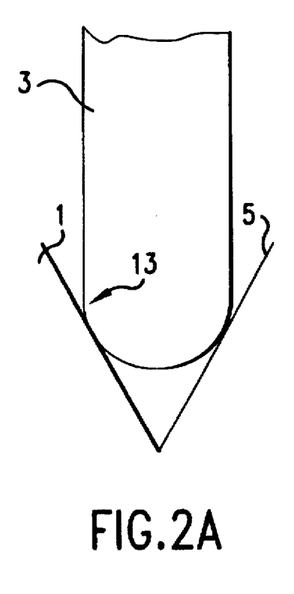
FIG. 2A is a partially sectional view showing an example of contact between a thin circular object and the support jig of the present invention.
Figure 2B:
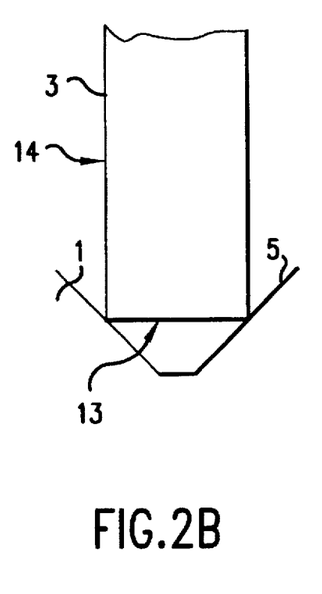
FIG. 2B is a partially sectional view showing another example of contact between a thin circular object and the support jig of the present invention.
Figure 2C:
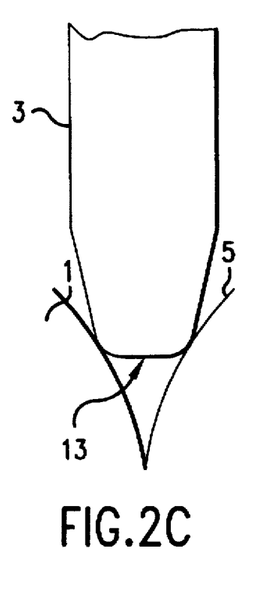
FIG. 2C is a partially sectional view showing a further example of contact between a thin circular object and the support jig of the present invention.

In the support jig 1, each thin circular object 3 contacts the support jig 1 through the cut end portions of two side wall portions 5 located on both sides of the cuts 6 thereof. The cut end portions of each side wall portion 5 emerge at both ends of the cut 6 of the side wall portion 5, and each cut end portion 5 defines a depression having a substantially V-shaped cross section. FIGS. 2A to 2C shows examples of contact between the thin circular object 3 and the support jig 1. A cut end portion as shown in FIGS. 2A to 2C newly emerges at either end of the cut of each side wall portion 5. The portion of the thin circular object which contacts each side wall portion 5 of the support jig 1 is a circumferential surface 13 of the object (FIG. 2A or 2C) or the boundary between the circumferential surface 13 and the main surface 14 of the object (FIG. 2B).

Figure 3:
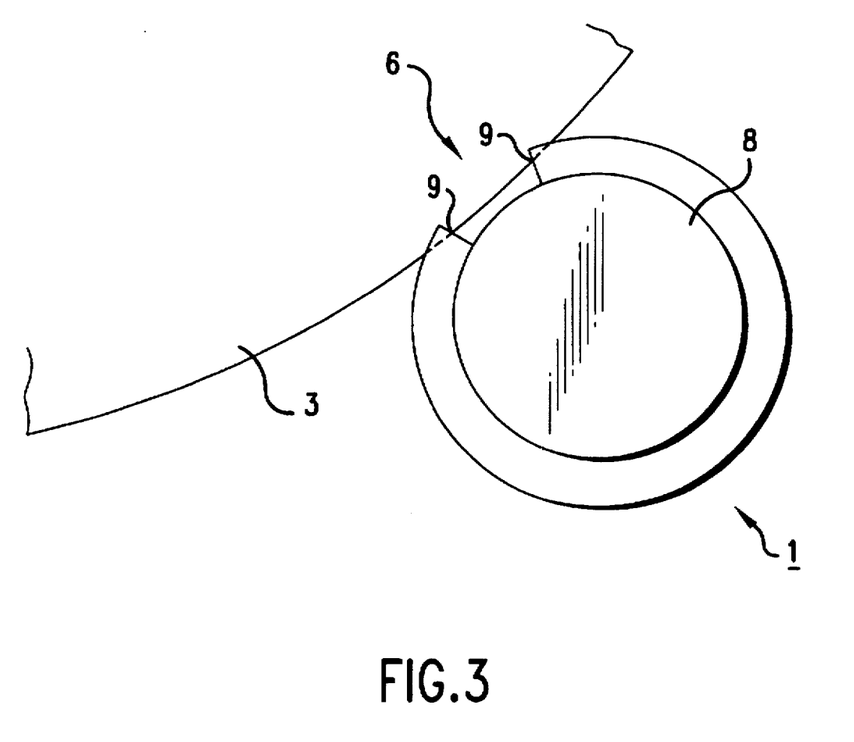
FIG. 3 is a schematic view showing the state of contact between a thin circular object and the support jig of the present invention.

As shown in FIG. 3, the width of the cut 6 must be selected such that the thin circular object 3 contacts the support jig 1 only at the cut end portions of the side wall portion emerging newly at both ends of the cut 6 and such that the thin circular object 3 and the support jig 1 do not contact each other on the perpendicular which connects the center of the supported thin circular object 3 and the center axis of the round bar 8. That is, when the width of the cut 6 is too large, the thin circular object 3 and the support jig 1 contact each other on the above-mentioned perpendicular. Numeral 9 in FIG. 3 denotes a point of contact between the thin circular object 3 and the support jig 1.

Figure 4:
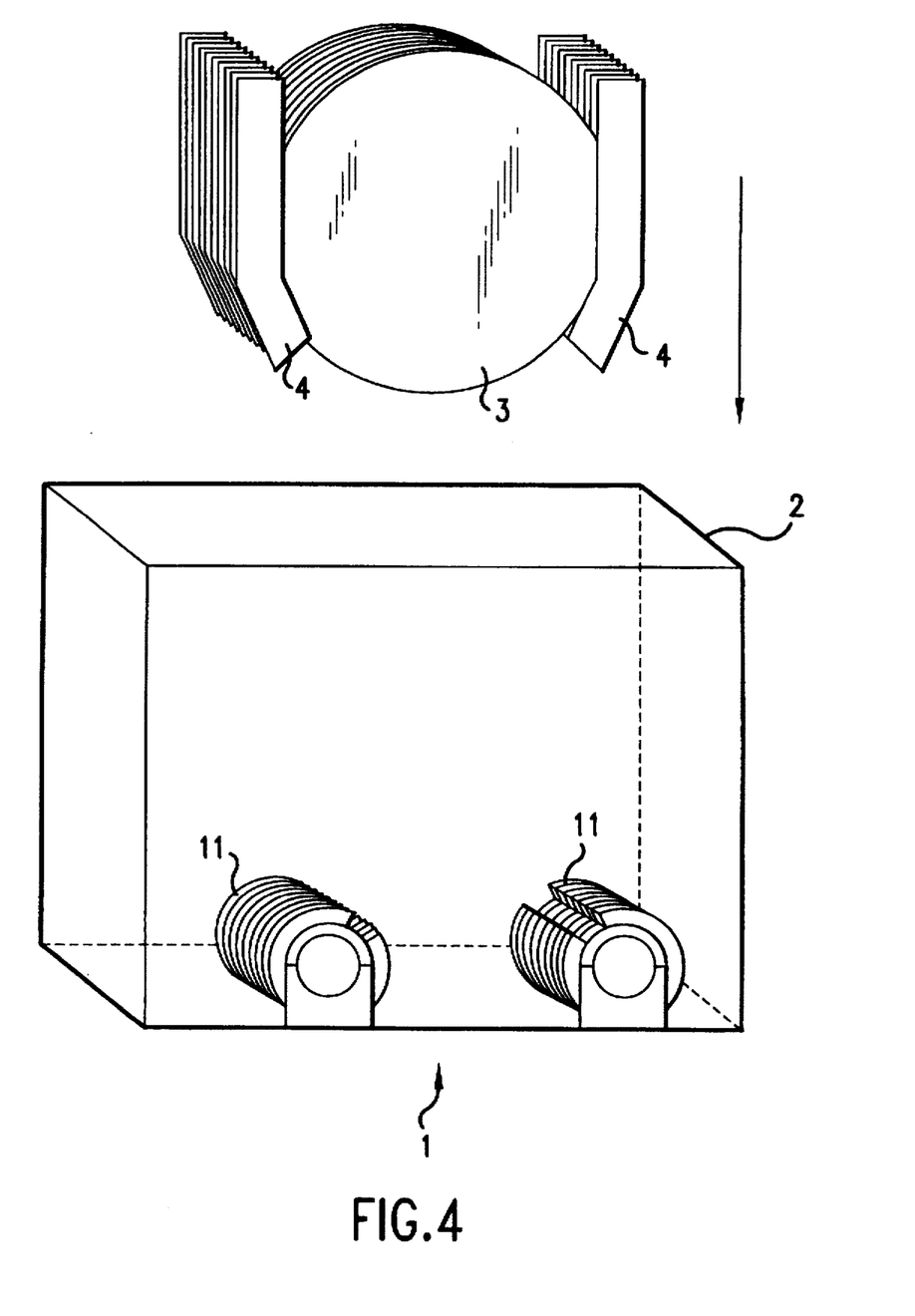
FIG. 4 is a schematic view showing a solution-processing bath equipped with the support jig of the present invention.
Figure 5:
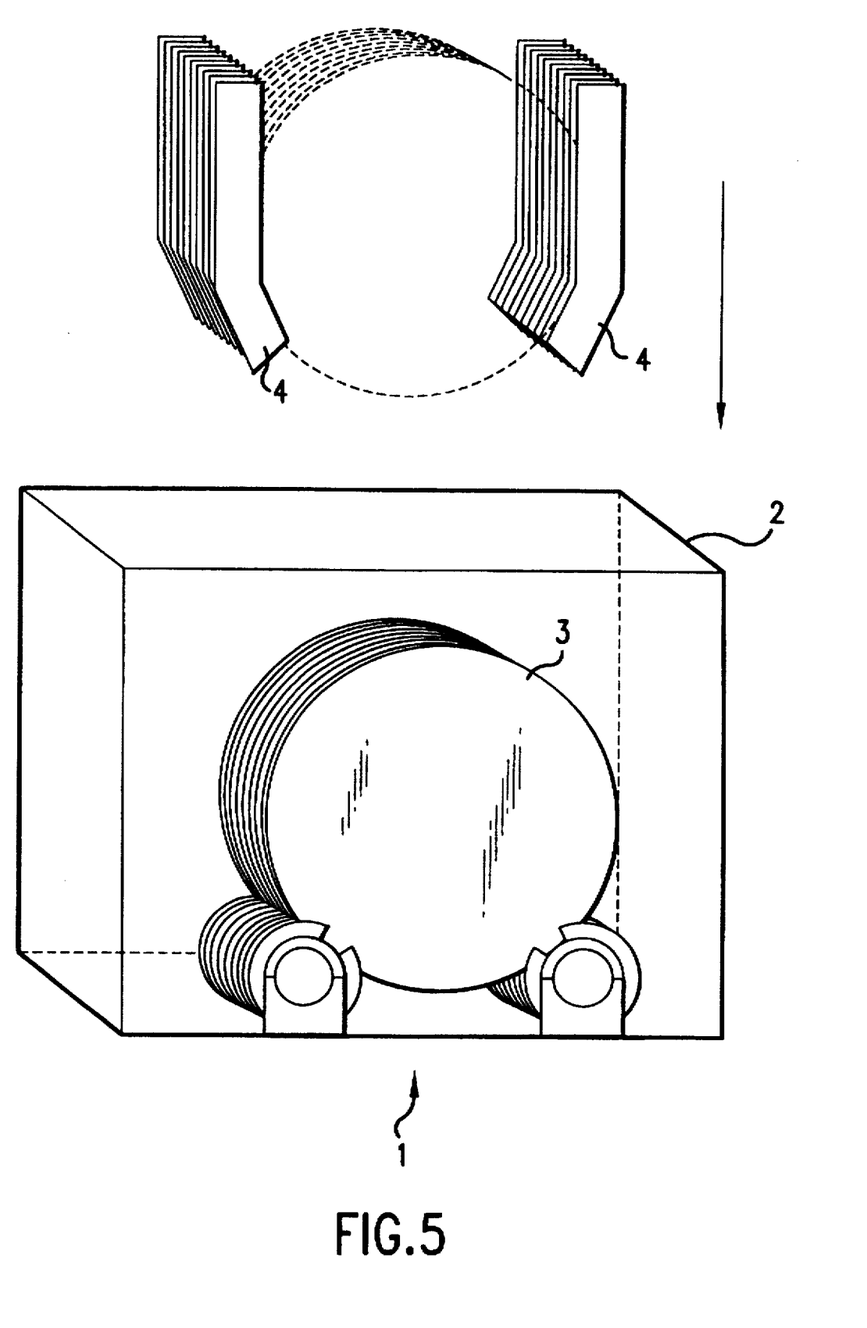
FIG. 5 is a schematic view showing the solution-processing bath of FIG. 4 in which thin circular objects are retained.

FIG. 4 shows an embodiment of a solution-processing bath 2 equipped with the support jig 1 of the present invention. Cassetteless arms 4 as shown in FIG. 4 are used to situate the thin circular objects 3, for example, semiconductor wafers, in the depressions 11 formed in the support jig 1 and having a substantially V-shaped cross section. FIG. 5 shows the state of the thin circular objects 3 being retained by the support jig 1 provided in the solution-processing bath 2 of the present invention. Examples of the solution-processing bath 2 include a cleaning bath and an etching bath. The support jig 1 is fixed on the bottom portion of the solution-processing bath 2 through, for example, fitting.

Figure 6:
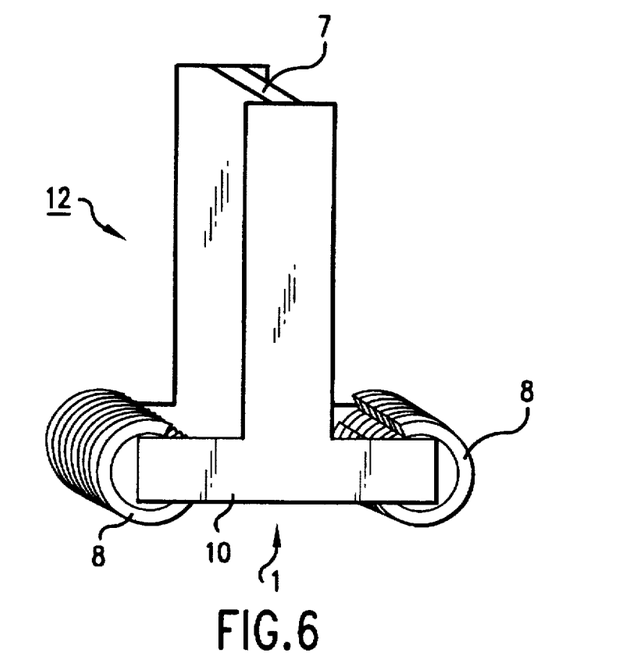
FIG. 6 is a schematic view showing an embodiment of a retaining jig serving also as a transport jig according to the present invention.
Figure 7:
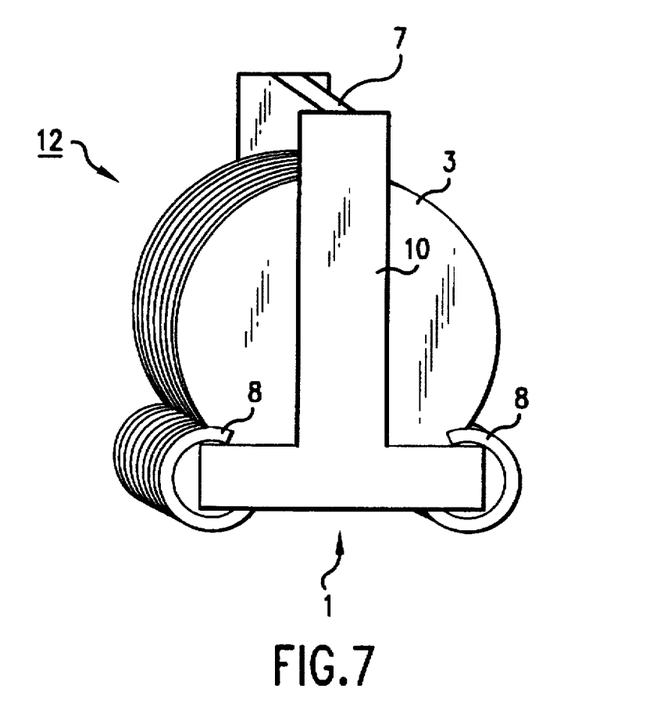
FIG. 7 is a schematic view showing the retaining jig of FIG. 6 in which thin circular objects are retained.

FIG. 6 shows an embodiment of a retaining jig 12 for thin circular objects comprising the support jig 1 of the present invention and a handle 7 and serving also as a transport jig. FIG. 7 shows the state of the thin circular objects 3 being retained in the retaining jig 12.

Figures 8, 9A, 9B:
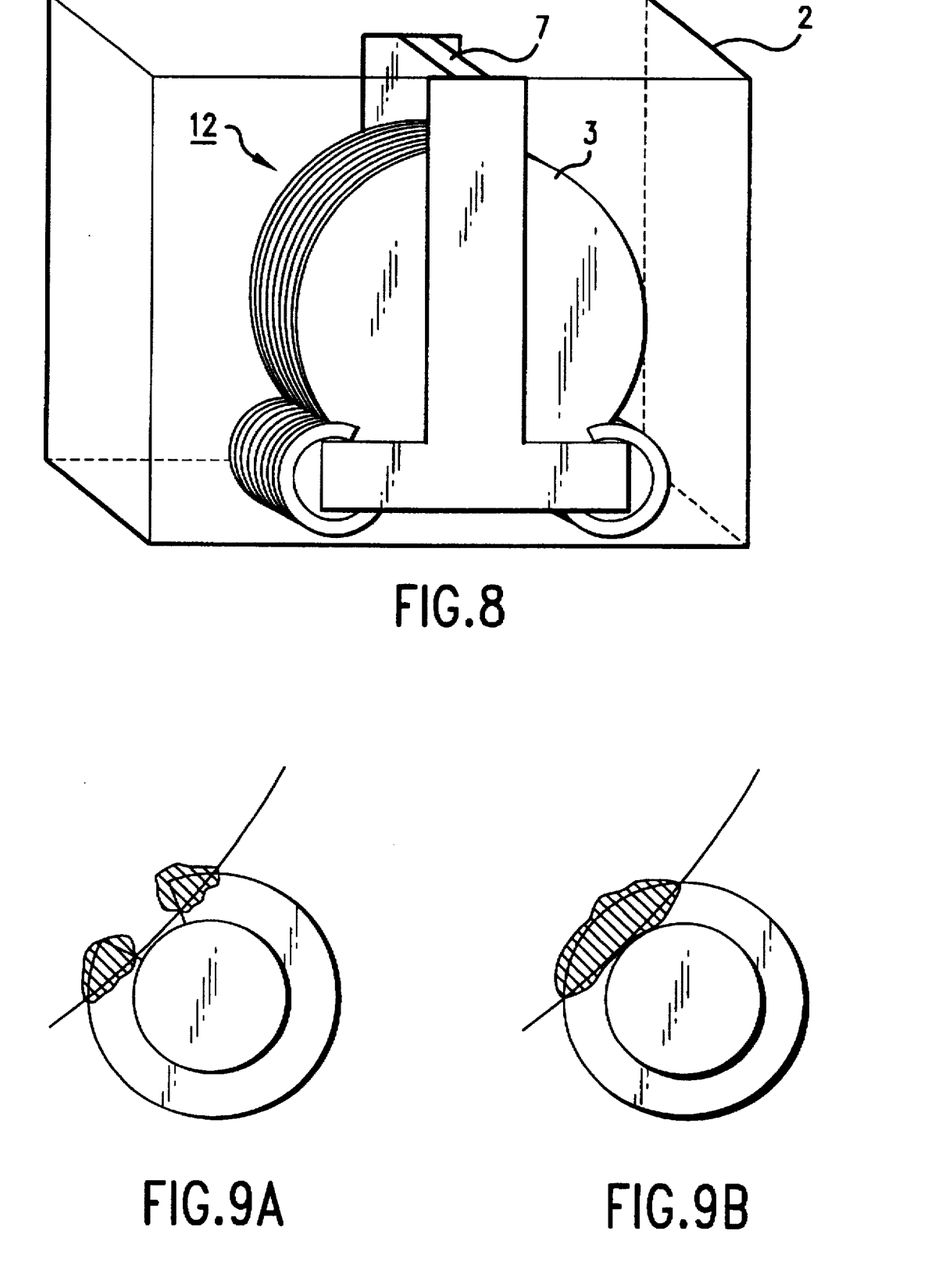
FIG. 8 is a schematic view showing the retaining jig of FIG. 7 which is placed in a solution-processing bath.
FIG. 9A is a view showing the state of adhesion of a cleaning solution when the support jig of the present invention is used.
FIG. 9B is a view showing the state of adhesion of a cleaning solution when a support jig having no cuts is used.

As shown in FIG. 8, the retaining jig 12 is placed in the solution-processing bath 2 while the thin circular objects 3 are retained therein. The thus-retained thin circular objects 3 are subjected to processing with a solution.

EXAMPLES

The present invention will next be described in detail by way of example.

Example 1

A support jig of the present invention having cuts and serving also as a transport jig as shown in FIG. 6 and a support jig having no cuts and serving also as a transport jig were prepared. Wafers were situated in each support jig. Subsequently, the thus-loaded support jigs were placed in a cleaning bath which contained a cleaning solution. Then, the support jigs were taken out from the cleaning bath, and the state of the cleaning solution adhering to the wafers was observed. The observed state of adhesion is shown in FIGS. 9A and 9B.

As shown in FIGS. 9A and 9B, the support jig of the present invention (FIG. 9A) is considerably smaller in area of adhesion of the cleaning solution (hatched portion) than the support jig having no cuts (FIG. 9B). This demonstrates that use of the support jig of the present invention improves cleaning efficiency.

Example 2

A cleaning bath equipped with a support jig of the present invention as shown in FIG. 4 and a cleaning bath equipped with a support jig having no cuts were prepared. Through use of cassetteless arms, eight wafers were situated in each support jig. Subsequently, pure water was poured into the cleaning baths, followed by application of ultrasonic waves. Then, the state of wafer surfaces was examined.

As a result, in cleaning through use of the support jig having no cuts, the generation of scratches on a wafer surface was observed with almost all wafers. By contrast, in cleaning through use of the support jig of the present invention, the generation of scratches on a wafer surface was not observed with all wafers.

Also, using each of the support jig of the present invention and the support jig having no cuts, 3000 wafers were cleaned. Subsequently, the thus-cleaned wafers were examined for stain remaining on a wafer surface in the vicinity of a point of contact between the support jig and a wafer. In cleaning through use of the support jig having no cuts, remaining stain was observed with 150 wafers. By contrast, in cleaning through use of the support jig of the present invention, remaining stain was observed only with 14 wafers. In other words, the rate of the generation of stain remaining in the vicinity of a point of contact between the support jig and a wafer was 5.0% when the support jig having no cuts was used, and was very small, less than 0.5%, when the support jig of the present invention was used.

The present invention is not limited to the above-described embodiments. The above-described embodiments are mere examples, and those having the substantially same structure as that described in the appended claims and providing the similar action and effects are included in the scope of the present invention.

What is claimed is:

1. A support jig for thin circular objects, comprising:

two round rods, in each of which depressions, each having a substantially V-shaped cross section, are formed along the circumference of the round rod and perpendicularly to the center axis of the round rod and arranged along the center axis of the round rod; and means for fixing the round rods in place, and which supports thin circular objects through insertion of them into respective depressions formed in the round rods, wherein a cut is formed in each of a plurality of side wall portions which define depressions such that the cut is symmetrical with respect to the perpendicular which connects the center of each of the supported thin circular objects and the center axis of each of the round bars.

2. A support jig according to claim 1, wherein said thin circular objects are semiconductor wafers.

3. A solution-processing bath for processing thin circular objects with a solution therein, said solution-processing bath being equipped with the-support jig according to claim 1.

4. A solution-processing bath according to claim 3, wherein said thin circular objects are semiconductor wafers.

5. A retaining jig for thin circular objects, comprising the support jig according to claim 1 and a handle, said retaining jig serving as a transport jig as well.

6. A retaining jig according to claim 5, wherein said thin circular objects are semiconductor wafers.

* * * * *